US008810698B2

(12) United States Patent
Hiramoto et al.

(10) Patent No.: US 8,810,698 B2
(45) Date of Patent: Aug. 19, 2014

(54) TWO SIDED SOLID STATE IMAGE SENSOR AND AN IMAGE CAPTURE DEVICE

(75) Inventors: Masao Hiramoto, Osaka (JP); Masayuki Misaki, Hyogo (JP); Teruyuki Takizawa, Osaka (JP); Masaaki Suzuki, Osaka (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 591 days.

(21) Appl. No.: 13/132,690

(22) PCT Filed: Sep. 24, 2010

(86) PCT No.: PCT/JP2010/005774
§ 371 (c)(1),
(2), (4) Date: Jun. 3, 2011

(87) PCT Pub. No.: WO2011/043025
PCT Pub. Date: Apr. 14, 2011

(65) Prior Publication Data
US 2011/0234869 A1   Sep. 29, 2011

(30) Foreign Application Priority Data

Oct. 7, 2009 (JP) .................................. 2009-233288

(51) Int. Cl.
*H04N 5/335* (2011.01)
*H04N 5/374* (2011.01)
*H04N 5/225* (2006.01)
*H01L 27/146* (2006.01)

(52) U.S. Cl.
CPC ............ *H04N 5/374* (2013.01); *H04N 5/2258* (2013.01); *H04N 5/2254* (2013.01); *H01L 27/14627* (2013.01); *H01L 27/14621* (2013.01); *H04N 5/2253* (2013.01); *H01L 27/1464* (2013.01)
USPC ....................................................... 348/294

(58) Field of Classification Search
CPC . H04N 5/335; H04N 5/2258; H01L 27/14627
USPC ........................................................... 348/294
See application file for complete search history.

(56) References Cited

U.S. PATENT DOCUMENTS

2004/0046894 A1* 3/2004 Adams et al. ................. 348/624
2006/0126185 A1* 6/2006 Oh et al. ........................ 359/619

(Continued)

FOREIGN PATENT DOCUMENTS

JP   06-326293 A   11/1994
JP   2005-347709 A   12/2005

(Continued)

OTHER PUBLICATIONS

International Search Report for corresponding International Application No. PCT/JP2010/005774 mailed Nov. 30, 2010.

(Continued)

*Primary Examiner* — Usman Khan
(74) *Attorney, Agent, or Firm* — Renner, Otto, Boisselle & Sklar, LLP

(57) ABSTRACT

A solid-state image sensor according to the present invention includes: a semiconductor layer (100 with first and second surfaces (100a, 100b), the second surface (100b) being opposite to the first surface (100a); a plurality of photosensitive cells (1a, 1b, etc.), which are arranged two-dimensionally in the semiconductor layer (100) between the first and second surfaces thereof (100a, 100b); a first array (200) of micro condenser lenses, which are arranged on the same side as the first surface (100a) to focus incoming light onto a first group of photosensitive cells that are included in those photosensitive cells; and a second array (300) of micro condenser lenses, which are arranged on the same side as the second surface (100b) to focus incoming light onto a second group of photosensitive cells that are also included in those photosensitive cells but that are different from the first group of photosensitive cells.

16 Claims, 10 Drawing Sheets

(56) References Cited

U.S. PATENT DOCUMENTS

| | | |
|---|---|---|
| 2008/0049112 A1* | 2/2008 | Lee .......................... 348/222.1 |
| 2008/0068478 A1 | 3/2008 | Watanabe |
| 2008/0173794 A1* | 7/2008 | Oike et al. ................ 250/208.1 |
| 2009/0135282 A1* | 5/2009 | Gidon ........................... 348/273 |

FOREIGN PATENT DOCUMENTS

| | | | |
|---|---|---|---|
| JP | 2006-054262 | A | 2/2006 |
| JP | 2006-080457 | A | 3/2006 |
| JP | 2007-306387 | A | 11/2007 |
| JP | 2008-072423 | A | 3/2008 |
| JP | 2008072423 | A * | 3/2008 |

OTHER PUBLICATIONS

Form PCT/ISA/237 for International Application No. PCT/JP2010/005774 dated Nov. 30, 2010 and partial English translation.

* cited by examiner

TWO SIDED SOLID STATE IMAGE SENSOR AND AN IMAGE CAPTURE DEVICE

TECHNICAL FIELD

The present invention relates to a solid-state image sensor and an image capture device.

BACKGROUND ART

Recently, the performance and functionality of digital cameras and digital movie cameras that use some solid-state image sensor such as a CCD and a CMOS (which will be sometimes simply referred to herein as an "image sensor") have been enhanced to an astonishing degree. In particular, the size of a pixel structure for use in a solid-state image sensor has been further reduced these days thanks to rapid development of solid-state image sensor processing technologies, thus getting an even greater number of pixels and drivers integrated together in a solid-state image sensor. And the performance of image sensors has been further enhanced as well. Meanwhile, cameras that use a backside illumination type image sensor, which receives incoming light on its reverse side, not on its front side with a wiring layer for the solid-state image sensor, have been developed just recently and their property has attracted a lot of attention these days. An ordinary image sensor receives incoming light on its front side with the wiring layer, and therefore, no small part of the incoming light would be lost due to the presence of a complicated structure on the front side. In the backside illumination type image sensor, on the other hand, nothing in its photodetector section will cut off the incoming light, and therefore, almost no part of the incoming light will be lost by the device structure. Such a backside illumination type solid-state image sensor is disclosed in Patent Document No. 1, for example.

Patent Document No. 2 discloses a technique for making a photoelectric conversion more efficiently at a pixel by providing a reflective film for the sidewall of the photoelectric conversion section of such a backside illumination type image sensor. On the other hand, Patent Document No. 3 discloses a technique for increasing the photoelectric conversion efficiency by providing a reflective layer behind a photosensitive section and by getting incoming light, which has been transmitted through a photoelectric conversion section, reflected by that reflective layer.

As disclosed in Patent Document No. 4, a backside illumination type image sensor may be formed by fabricating a conventional image sensor that receives incoming light on its front side, bonding a substrate to the front side, and then partially removing its reverse side to a level where the photosensitive section can sense the incoming light.

CITATION LIST

Patent Literature

Patent Document No. 1: Japanese Patent Application Laid-Open Publication No. 2005-347709
Patent Document No. 2: Japanese Patent Application Laid-Open Publication No. 2006-80457
Patent Document No. 3: Japanese Patent Application Laid-Open Publication No. 2006-54262
Patent Document No. 4: Japanese Patent Application Laid-Open Publication No. 6-326293

SUMMARY OF INVENTION

Technical Problem

No matter whether it is a front side illumination type or a backside illumination type, such a solid-state image sensor can capture an image only on one side, not both sides thereof.

It is therefore an object of the present invention to provide a solid-state image sensor and image capture device that can capture an image on both sides thereof using mutually different pixels on the front and reverse sides of the image sensor.

Solution to Problem

A solid-state image sensor according to the present invention includes: a semiconductor layer having first and second surfaces, the second surface being opposite to the first surface; a plurality of photosensitive cells, which are arranged two-dimensionally in the semiconductor layer between the first and second surfaces thereof; a first array of micro condenser lenses, which are arranged on the same side as the first surface in order to focus incoming light onto a first group of photosensitive cells that are included in those photosensitive cells; and a second array of micro condenser lenses, which are arranged on the same side as the second surface in order to focus incoming light onto a second group of photosensitive cells that are also included in those photosensitive cells but that are different from the first group of photosensitive cells.

In one preferred embodiment, the photosensitive cells are arranged in columns and rows, and the photosensitive cells that form the first and second groups are arranged so that photosensitive cells belonging to these two groups alternate with each other in both column and row directions.

In this particular preferred embodiment, each of the multiple photosensitive cells is located within an associated one of multiple rectangular pixel regions.

In a specific preferred embodiment, each of the micro condenser lenses that form the first array has a diamond shape.

In a specific preferred embodiment, each of the micro condenser lenses that form the second array has a diamond shape.

In another specific preferred embodiment, each of the micro condenser lenses that form the second array has a rectangular shape.

In still another preferred embodiment, the arrangement pitch of the micro condenser lenses that form the first array is twice as long as that of the pixel regions.

In this particular preferred embodiment, each of the micro condenser lenses that form the first array has twice as large an area as its associated one of the pixel regions.

In yet another preferred embodiment, the arrangement pitch of the micro condenser lenses that form the second array is twice as long as that of the pixel regions.

In this particular preferred embodiment, each of the micro condenser lenses that form the second array has twice as large an area as its associated one of the pixel regions.

In yet another preferred embodiment, the arrangement of micro condenser lenses that form the first array and the arrangement of micro condenser lenses that form the second array will lie one on top of another in a plan view if one of these two arrangements is translated with respect to the other arrangement.

In yet another preferred embodiment, the arrangement of micro condenser lenses that form the first array and the arrangement of micro condenser lenses that form the second array will not lie one on top of another in a plan view even if one of these two arrangements is translated with respect to the other arrangement.

In yet another preferred embodiment, each of the micro condenser lenses that form the first array has a different area from an associated one of the micro condenser lenses that form the second array.

In yet another preferred embodiment, the photosensitive cells are arranged so that one row of photosensitive cells is shifted by a half pitch from an adjacent row of photosensitive cells. And if one row of photosensitive cells belongs to the first group, each adjacent row of photosensitive cells belongs to the second group.

In this particular preferred embodiment, the photosensitive cells are located within multiple diamond pixel regions.

In a specific preferred embodiment, each of the micro condenser lenses that form the first and second arrays has a rectangular shape.

An image capture device according to the present invention includes a solid-state image sensor and an optical system that makes light incident on the solid-state image sensor. The solid-state image sensor includes: a semiconductor layer having first and second surfaces, the second surface being opposite to the first surface; a plurality of photosensitive cells, which are arranged two-dimensionally in the semiconductor layer between the first and second surfaces thereof; a first array of micro condenser lenses, which are arranged on the same side as the first surface in order to focus incoming light onto a first group of photosensitive cells that are included in those photosensitive cells; and a second array of micro condenser lenses, which are arranged on the same side as the second surface in order to focus incoming light onto a second group of photosensitive cells that are also included in those photosensitive cells but that are different from the first group of photosensitive cells. The optical system makes light that has come from a subject incident on the first and second arrays.

Advantageous Effects of Invention

A solid-state image sensor according to the present invention receives incoming light on both of first and second surfaces thereof. On top of that, the target photosensitive cells on which the incoming light should be focused by micro condenser lenses on the first surface side are different from the target cells on the second surface side. That is why two different images can be captured simultaneously and separately from each other on the front and reverse sides. Besides, if the micro condenser lenses are arranged in one pattern on the front side and in another pattern on the reverse side, the image capturing operations can be carried out with two different sampling points and frequencies adopted on the front and reverse sides.

DESCRIPTION OF EMBODIMENTS

First of all, typical basic arrangements for conventional solid-state image sensors will be described with reference to FIGS. 1A and 1B, which illustrate exemplary cross sections of a front side illumination type solid-state image sensor and a backside illumination type solid-state image sensor, respectively.

Figure 1A:
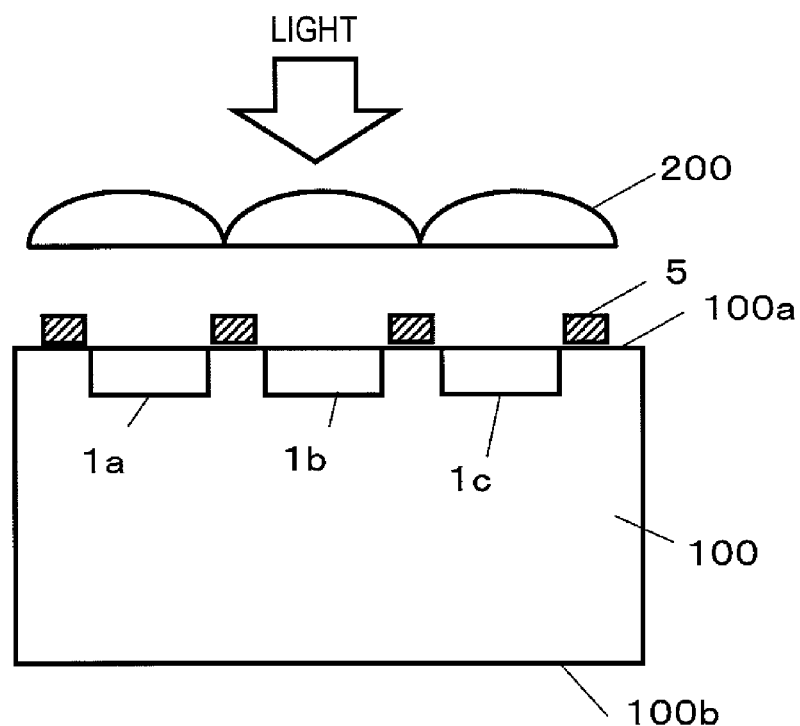
FIG. 1A is a cross-sectional view illustrating a front side illumination type solid-state image sensor.

The solid-state image sensor shown in FIG. 1A includes a semiconductor layer 100 that has a first surface (i.e., front side) 100a and a second surface (i.e., reverse side) 100b opposite to the first surface 100a, and a plurality of photosensitive cells 1a, 1b, 1c, etc., which are arranged two-dimensionally in the semiconductor layer 100 between the first and second surfaces 100a and 100b. On the first surface (front side) 100a of the semiconductor layer 100, arranged is wiring 5 that connects those photosensitive cells 1a, 1b, 1c, etc. to a driver (not shown). Also arranged over the first surface 100a of the semiconductor layer 100 is an array 200 of micro condenser lenses that focus the incoming light onto the respective photosensitive cells 1a, 1b, 1c, etc.

As for the front side illumination type, the light is incident on the photosensitive cells 1a, 1b, 1c, etc. through the first surface 100a.

Figure 1B:
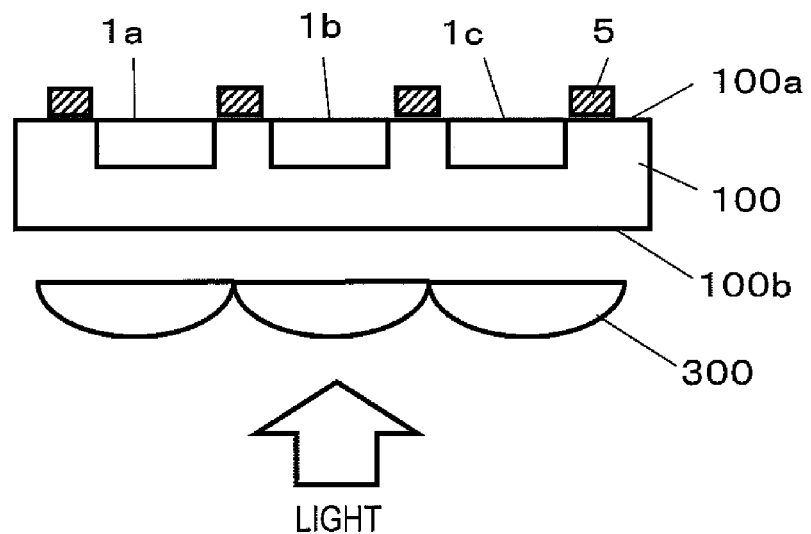
FIG. 1B is a cross-sectional view illustrating a backside illumination type solid-state image sensor.

The solid-state image sensor shown in FIG. 1B also includes a semiconductor layer 100 that has a first surface (i.e., front side) 100a and a second surface (i.e., reverse side) 100b opposite to the first surface 100a, and a plurality of photosensitive cells 1a, 1b, 1c, etc., which are arranged two-dimensionally in the semiconductor layer 100 between the first and second surfaces 100a and 100b. However, this image sensor is designed so that by using a semiconductor layer 100 that is thinner than the semiconductor layer 100 shown in FIG. 1A, the light incident on the second surface 100b reaches the photosensitive cells 1a, 1b, 1c, etc. efficiently. In this backside illumination type, wiring 5 is also arranged on the first surface 100a of the semiconductor layer 100 but there is no array 200 of micro condenser lenses that focus the incoming light onto the respective photosensitive cells 1a, 1b, 1c, etc. Instead, an array 300 of micro condenser lenses is arranged on the second surface 100b so as to focus the incoming light onto the respective photosensitive cells 1a, 1b, 1c, etc.

Next, a basic arrangement for a solid-state image sensor according to the present invention will be described with reference to FIG. 2, which schematically illustrates a cross section of an exemplary solid-state image sensor according to the present invention.

Figure 2:
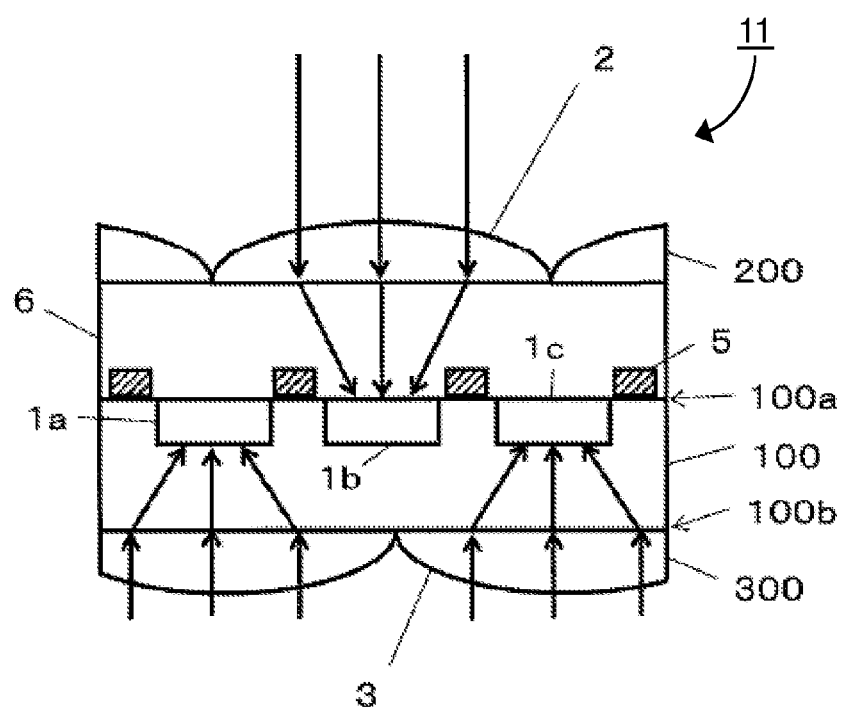
FIG. 2 is a cross-sectional view schematically illustrating an exemplary configuration for a dual-side illumination type solid-state image sensor for use in the present invention.

The solid-state image sensor shown in FIG. 2 also includes a semiconductor layer 100 that has a first surface (i.e., front side) 100a and a second surface (i.e., reverse side) 100b opposite to the first surface 100a, and a plurality of photosensitive cells 1a, 1b, 1c, etc., which are arranged two-dimensionally in the semiconductor layer 100 between the first and second surfaces 100a and 100b. On the first surface (front side) 100a of the semiconductor layer 100, arranged is wiring 5 that connects those photosensitive cells 1a, 1b, 1c, etc. to a driver (not shown).

According to a preferred embodiment of the present invention, a first array 200 of micro condenser lenses and a second array 300 of micro condenser lenses are arranged on two sides of the semiconductor layer 100 with the first and second surfaces 100a and 100b, respectively. The first array 200 of micro condenser lenses focuses the incoming light onto only some of the photosensitive cells 1a, 1b, 1c, etc. (e.g., onto the photosensitive cell 1b in the example illustrated in FIG. 2), not all of those cells 1a, 1b, 1c, etc. On the other hand, the second array 300 of micro condenser lenses focuses the incoming light onto the rest of the photosensitive cells 1a, 1b, 1c, etc. (e.g., onto the photosensitive cells 1a and 1c in the example illustrated in FIG. 2) on which the first array 200 of micro condenser lenses does not focus the incoming light.

Hereinafter, preferred embodiments of the present invention will be described. In the following description, any member that is shown in each and every one of the drawings and that has substantially the same function will be identified by the same reference numeral in not only the drawings but also the entire description.

(Embodiment 1)

Figure 3:
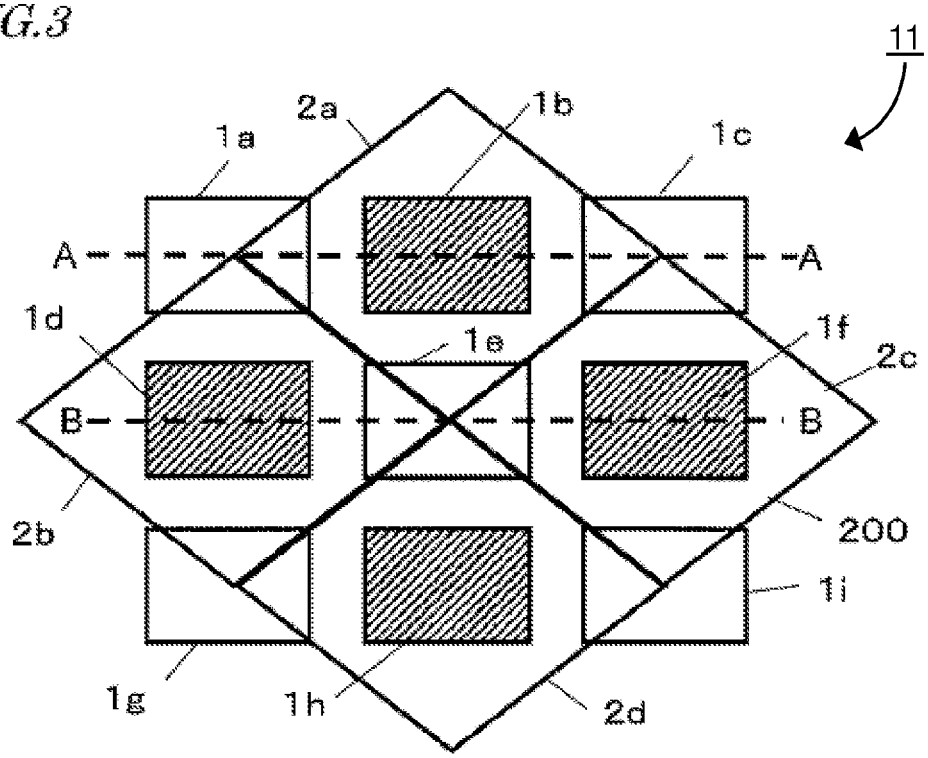
FIG. 3 is a top plan view of a solid-state image sensor according to a first preferred embodiment of the present invention.
Figure 4:
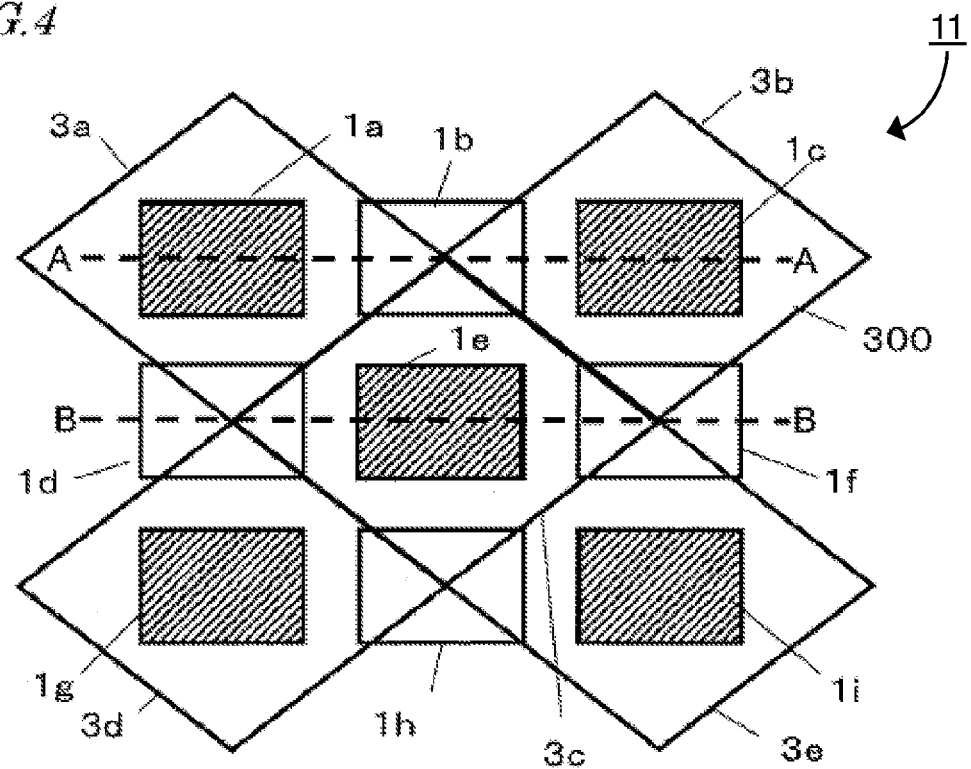
FIG. 4 is a bottom plan view of the solid-state image sensor of the first preferred embodiment of the present invention.
Figure 5A:
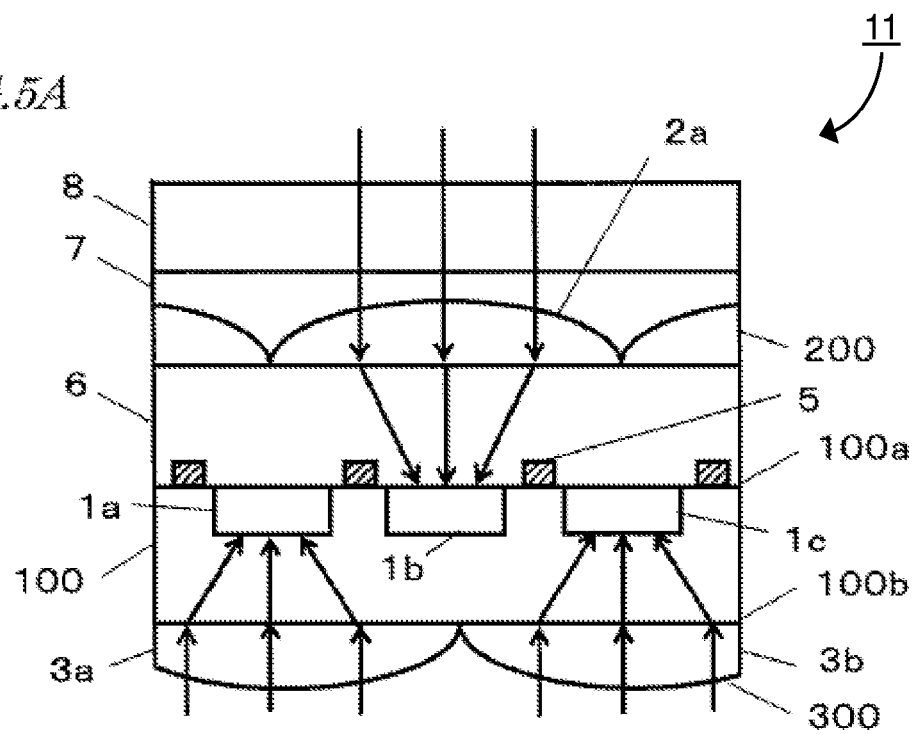
FIG. 5A is a cross-sectional view of the solid-state image sensor as viewed on the plane A-A shown in FIG. 3.
Figure 5B:
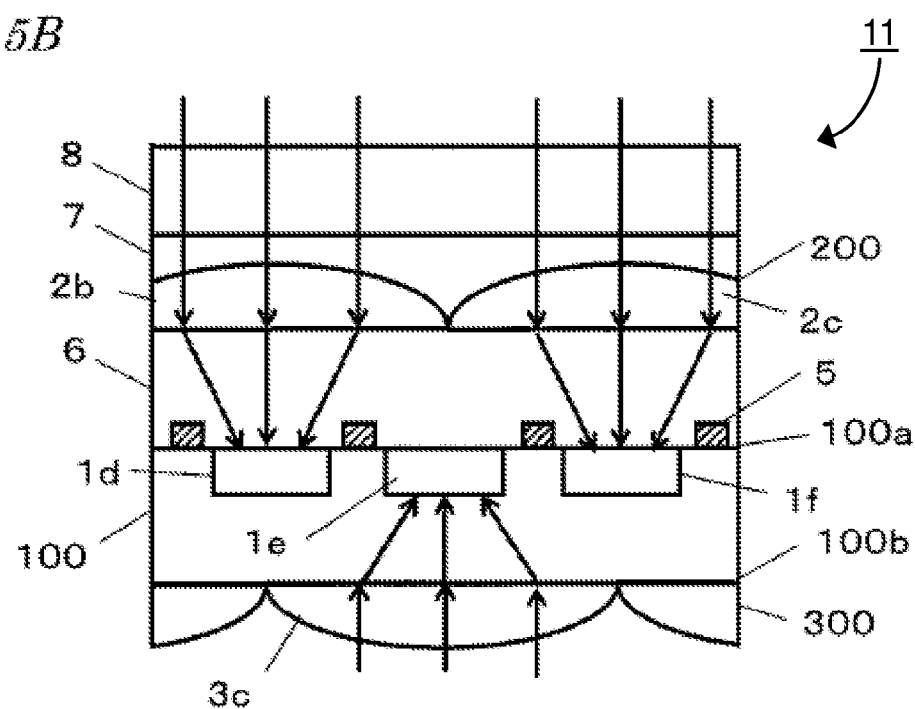
FIG. 5B is a cross-sectional view of the solid-state image sensor as viewed on the plane B-B shown in FIG. 3.

Hereinafter, a first specific preferred embodiment of a solid-state image sensor according to the present invention will be described with reference to FIGS. 3, 4, 5A and 5B. Specifically, FIGS. 3 and 4 illustrate planar layouts to adopt respectively for the front and reverse sides of the solid-state image sensor of this preferred embodiment. FIGS. 5A and 5B are cross-sectional views of the image sensor as respectively viewed on the planes A-A and B-B shown in FIG. 3.

As shown in FIGS. 5A and 5B, the solid-state image sensor of this preferred embodiment includes a semiconductor layer 100 that has a first surface (i.e., front side) 100a and a second surface (i.e., reverse side) 100b opposite to the first surface 100a, and a plurality of photosensitive cells 1a, 1b, 1c, etc., which are arranged two-dimensionally in the semiconductor layer 100 between the first and second surfaces 100a and 100b. The photosensitive cells 1a, 1b, 1c, etc. are typically photodiodes and are formed by introducing and diffusing a dopant into the semiconductor layer 100. Each of the photosensitive cells 1a, 1b, 1c, etc. photoelectrically converts the incoming light into electrical charge so that the quantity of the charge generated is proportional to the quantity of the light received.

On the first surface 100a of the semiconductor layer 100, arranged is wiring 5 that connects those photosensitive cells 1a, 1b, 1c, etc. to a driver (not shown). The solid-state image sensor actually needs to have switching transistors and other devices (not shown) in or on the semiconductor layer 100. However, as everybody in the art knows what circuit configuration and what method need to be used to read charge signals from those photosensitive cells 1a, 1b, 1c, etc., a detailed description thereof will be omitted herein.

On the first surface 100a of the semiconductor layer 100, also arranged is a transparent material layer 6 that covers the wiring 5. On that transparent material layer 6, arranged is the first array 200 of micro condenser lenses. Further stacked in this order on the first array 200 are a transparent layer 7, which has a lower refractive index than the lens material, and a transparent substrate 8. On the other hand, on the second surface 100b of the semiconductor layer 100, arranged is the second array 300 of micro condenser lenses.

The planar layout of the first array 200 of micro condenser lenses is shown in FIG. 3, which illustrates, for the sake of simplicity, only four lenses 2a, 2b, 2c and 2d among a huge number of micro condenser lenses that actually form the first array 200 and only nine photosensitive cells 1a, 1b, 1c, ... and 1i among a great many photosensitive cells that form an actual array. In this preferred embodiment, the photosensitive cells 1a, 1b, 1c, ... and 1i are arranged in columns and rows.

As can be seen from FIG. 3, the lenses 2a, 2b, 2c and 2d focus the incoming light onto the photosensitive cells 1b, 1d, 1f and 1h, respectively. That is to say, only four of the nine photosensitive cells 1a, 1b, 1c, ... and 1i (i.e., just the photosensitive cells that form a first group) are irradiated with the incoming light on this first surface 100a. In FIG. 3, those photosensitive cells 1b, 1d, 1f and 1h that are illuminated on the front side are shadowed.

The planar layout of the second array 300 of micro condenser lenses arranged on the second surface 100b of the semiconductor layer 100 is shown in FIG. 4, which illustrates, for the sake of simplicity, only five lenses 3a, 3b, 3c, 3d and 3e among a huge number of micro condenser lenses that actually form the second array 300 and only nine photosensitive cells 1a, 1b, 1c, ... and 1i among a great many photosensitive cells that form an actual array. As can be seen from FIG. 4, the lenses 3a, 3b, 3c, 3d and 3e focus the incoming light onto the photosensitive cells 1a, 1c, 1e, 1g and 1i, respectively. That is to say, only the rest of the nine photosensitive cells 1a, 1b, 1c, ... and 1i (i.e., just the photosensitive cells that form a second group) are irradiated with the incoming light through this second surface 100b. In FIG. 4, those photosensitive cells 1a, 1c, 1e, 1g and 1i that are illuminated on the reverse side are shadowed.

As can be seen, according to this preferred embodiment, the photosensitive cells 1b, 1d, 1f and 1h that form the first group and the photosensitive cells 1a, 1c, 1e, 1g and 1i that form the second group are arranged alternately in both of column and row directions, thereby forming a checkerboard pattern.

Also, as can be seen easily by comparing FIGS. 3 and 4 to each other, the first array 200 of micro condenser lenses and the second array 300 of micro condenser lenses will lie one on top of another in a plan view if one of these two arrays is translated with respect to the other.

Figure 6:
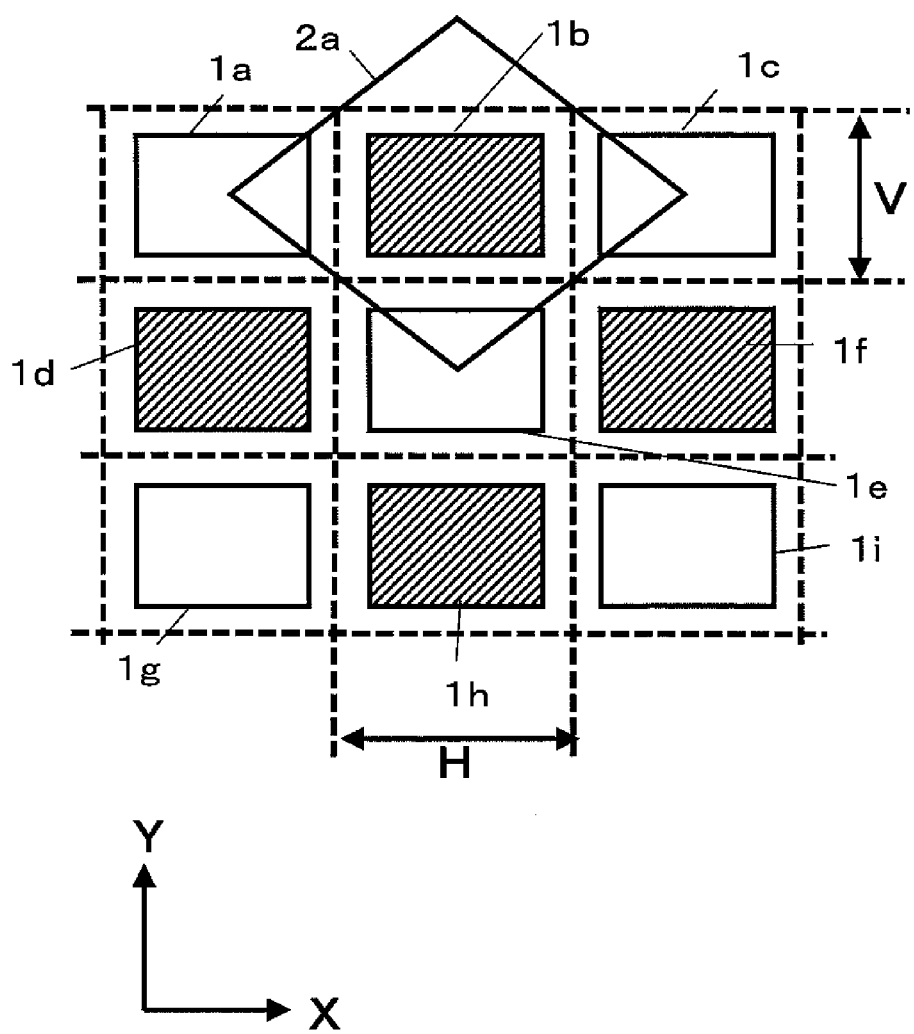
FIG. 6 is a plan view showing the size of a single pixel region in the solid-state image sensor according to the first preferred embodiment of the present invention.

Next, take a look at FIG. 6, which is a drawing corresponding to FIG. 3 but illustrates only the lens 2a for the sake of simplicity. Also, in FIG. 6, dashed lines are drawn as border lines between the respective photosensitive cells 1a, 1b, 1c, ... and 1i. A plurality of rectangles (which may be squares in some cases) are formed by these dashed lines that cross each other at right angles and each side of those rectangles is located, and defines a border line, between two adjacent pixels. Each of multiple regions that are defined by these dashed lines includes a single photosensitive cell and will be referred to herein as a "pixel region". The sizes of each pixel region as measured in the X and Y directions will be identified herein by "H" and "V", respectively. That is to say, the horizontal pixel pitch is H and the vertical pixel pitch is V. The pixel regions do not have to have such a rectangular shape but may have a square, diamond, hexagonal or octagonal shape, too. On top of that, the photosensitive cells do not always have to have an analogous shape to the pixel regions. In any case, the size of each photosensitive cell needs to be equal to or smaller than that of its associated pixel region.

Each of those pixel regions has its size determined by the arrangement pitch of the photosensitive cells. In this preferred embodiment of the present invention, each of the lenses that form the first and second arrays 200 and 300 of micro condenser lenses has a bigger size than each pixel region. As shown in FIG. 6, the micro condenser lens has a diamond shape. And when viewed perpendicularly to the image capturing plane, the outer periphery of each micro condenser lens is circumscribed to that of its associated pixel region. The area of the micro condenser lens is twice as large as that of the pixel region. In the solid-state image sensor of this preferred embodiment, the number of pixels that receive the incoming light on the front side is a half of the total number of pixels. The arrangement of those pixels that receive the incoming light on the front side is determined by the arrangement of the micro condenser lenses. Consequently, according to this preferred embodiment, a pixel shifted arrangement is realized both horizontally and vertically alike. As can be seen from FIG. 4, the same arrangement can be adopted on the reverse side, too.

According to this preferred embodiment, each micro condenser lens has a larger area than its associated pixel region, on which the incoming light is focused by the micro condenser lens, and partially overlaps with other pixel regions that surround that associated pixel region. Now, let's take the micro condenser lens 2a and the photosensitive cell 1b shown in FIG. 6 as an example. The micro condenser lens 2a partially overlaps with photosensitive cells (such as the photosensitive cells 1a and 1c) that are adjacent to the photosensitive cell 1b. That is why the micro condenser lens 2a can focus a part of the light that is going to enter the photosensitive cells (e.g., the photosensitive cells 1a and 1c) that are adjacent to the photosensitive cell 1b onto the photosensitive cell 1b. According to this preferred embodiment, this function of the micro condenser lens 2a doubles the focusing area of the photosensitive cell 1b. In this sense, it can be said that the micro condenser lens 2a effectively doubles the area of the pixel region that is associated with the photosensitive cell 1b. In this manner, according to this preferred embodiment, the array 200 of the Micro condenser lenses can change effectively the arrangement of pixels.

As shown in FIGS. 3 and 4, the arrangement pitch of the micro condenser lenses is greater than (e.g., twice as large as) that of the pixel regions (or that of the photosensitive cells).

According to this preferred embodiment, by adopting such relative arrangements between those micro condenser lenses and the photosensitive cells representing pixels, the image sensor can capture two different images separately from each other on the front and reverse sides thereof. In addition, the pixel shifted arrangement is realized on each of these two sides. That is why even though only a half of all pixels can be used for capturing an image on the front side, the resolution decreases neither horizontally not vertically. On top of that, as each micro condenser lens has twice as large an area as its associated pixel region, the sensitivity can be doubled. Likewise, even though only the other half of the pixels can be used for capturing an image on the reverse side, the resolution decreases neither horizontally not vertically. On top of that, as each micro condenser lens has twice as large an area as its associated pixel region, the sensitivity can be doubled, too.

Hereinafter, a preferred embodiment of an image capture device that uses such an image sensor will be described with reference to FIG. 7, which illustrates a configuration for an image capture device according to this preferred embodiment.

Figure 7:
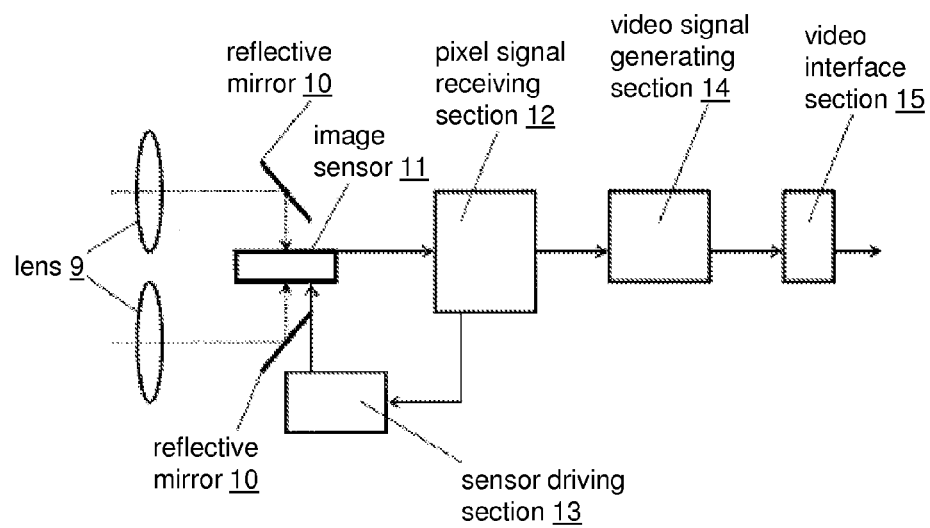
FIG. 7 illustrates an arrangement for an image capture device according to the first preferred embodiment of the present invention.

The image capture device shown in FIG. 7 is a binocular camera including two lenses 9 and the solid-state image sensor 11 described above. The interval between the two lenses 9 may be in the range of 1 through 20 centimeters, for example. Two reflective mirrors 10 are respectively arranged so as to guide the light that has been transmitted through the two lenses 9 onto the front and reverse sides of the solid-state image sensor 11. Thus, two images that have a parallax between them enter the solid-state image sensor 11 at the same time, and then are photoelectrically converted by their associated groups of photosensitive cells. Consequently, according to this preferred embodiment, the single solid-state image sensor 11 can capture simultaneously two images of the same subject as viewed from two different angles.

This image capture device includes a signal generating and pixel signal receiving section 12, a sensor driving section 13, a video signal generating section 14, and a video interface section 15.

The signal generating and pixel signal receiving section 12 not only generates a fundamental signal to drive the image sensor 11 but also receives a pixel signal from the solid-state image sensor 11. The sensor driving section 13 receives the fundamental signal to drive the solid-state image sensor 11 from the signal generating and pixel signal receiving section 12, thereby generating a drive signal for the solid-state image sensor 11. The video signal generating section 14 receives an image signal from the signal generating and pixel signal receiving section 12 and generates a video signal. And the video interface section 15 outputs a video signal to an external device.)

In the image capture device of this preferred embodiment having the configuration shown in FIG. 7, the two lenses 9 respectively produce two different subject images on the front and reverse sides of the solid-state image sensor 11 by way of the reflective mirrors 10. The image that has been produced by one of the two lenses 9 is photoelectrically converted by the first group of photosensitive cells of the solid-state image sensor 11, thereby generating a first image signal. On the other hand, the image that has been produced by the other lens 9 is photoelectrically converted by the second group of photosensitive cells of the solid-state image sensor 11, thereby generating a second image signal.

These two image signals are supplied through the signal generating and pixel signal receiving section 13 to the video signal generating section 14, which generate two video signals in response. And those two video signals are output as video information with parallax to an external device through the video interface section. Each of the two images output has been generated based on only a half of the pixels of the image sensor. However, since the pixel shifted arrangement is adopted in this preferred embodiment, those images can be used as binocular camera images without decreasing the horizontal or vertical resolution and with sufficiently high image quality maintained.

According to this preferred embodiment, in a dual-side illumination solid-state image sensor, diamond micro condenser lenses are arranged with respect to their associated rectangular pixel regions on each of the front and reverse sides as described above. And by setting their area ratio to be one to two, a pixel shifted arrangement is realized on each side of the solid-state image sensor. As a result, two high-quality, high-sensitivity images can be obtained separately from each other without decreasing the resolution at all. On top of that, by using such a dual-side illumination solid-state image sensor, the function of a binocular camera is realized by that solid-state image sensor alone.

It should be noted, however, that the image capture device of the present invention does not have to be such a binocular stereo camera but could also be implemented as anything else that uses the two images captured.

(Embodiment 2)

Hereinafter, a second preferred embodiment of an image sensor according to the present invention will be described with reference to FIG. 8.

Figure 8:
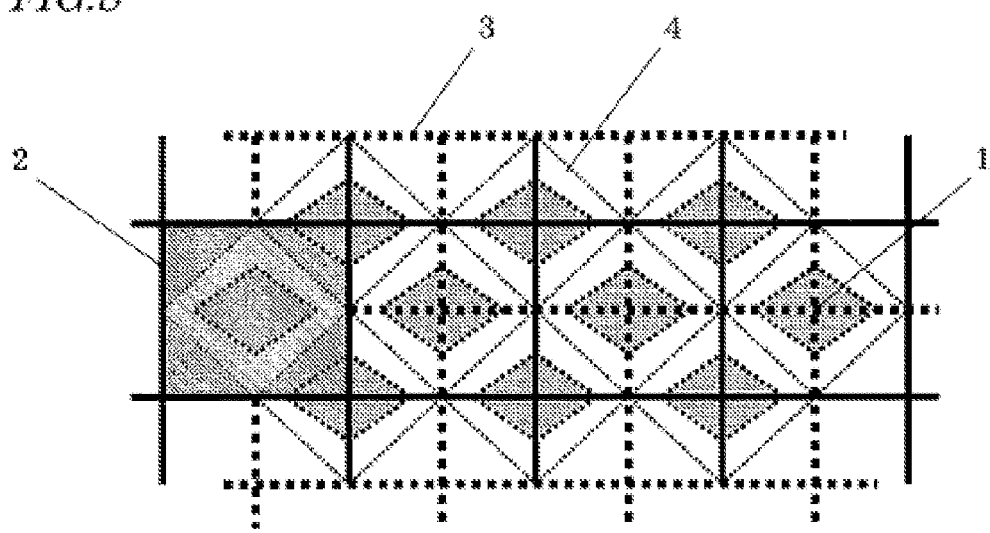
FIG. 8 illustrates a planar layout for an image sensor as a second preferred embodiment of the present invention.

FIG. 8 is a top plan view of an image sensor illustrating the relative arrangement of micro condenser lenses with respect to pixels according to this preferred embodiment. In this preferred embodiment, both the photosensitive cells 1 and the pixel regions 4 have a diamond shape. On the other hand, each of the micro condenser lenses 2 and 3 that are provided for the front and reverse sides of the solid-state image sensor has a rectangular shape.

That is to say, according to this preferred embodiment, a rectangular micro condenser lens is provided for a diamond pixel region and each of the micro condenser lenses 2 and 3 is circumscribed to its associated pixel region 4. And their area ratio is one to two.

On each of the front and reverse sides of the solid-state image sensor, the number of pixels that receive the incoming light is a half as large as the total number of pixels. In both of the row and column directions, the pixels are arranged in line. That is to say, according to this preferred embodiment, the pixel shifted arrangement is not realized. For that reason, compared to the solid-state image sensor of the first preferred embodiment described above, the resolution decreases according to this preferred embodiment both horizontally and vertically alike. Nevertheless, since the pixels to receive the light that has been incident on the front side of the image sensor are different from the pixels to receive the light that has been incident on the reverse side thereof, images can also be captured on both of the front and reverse sides of the image sensor.

According to this preferred embodiment, in a dual-side illumination image sensor, rectangular micro condenser lenses are arranged with respect to their associated diamond pixel regions on each of the front and reverse sides as described above. As a result, two images can be obtained separately from each other on the front and reverse sides of the image sensor. On top of that, by arranging micro condenser lenses, each of which has twice as large an area as its associated pixel region, the sensitivity can be doubled, too.

(Embodiment 3)

Hereinafter, a third preferred embodiment of a solid-state image sensor according to the present invention will be described with reference to FIGS. 9, 10A and 10B.

Figure 9:
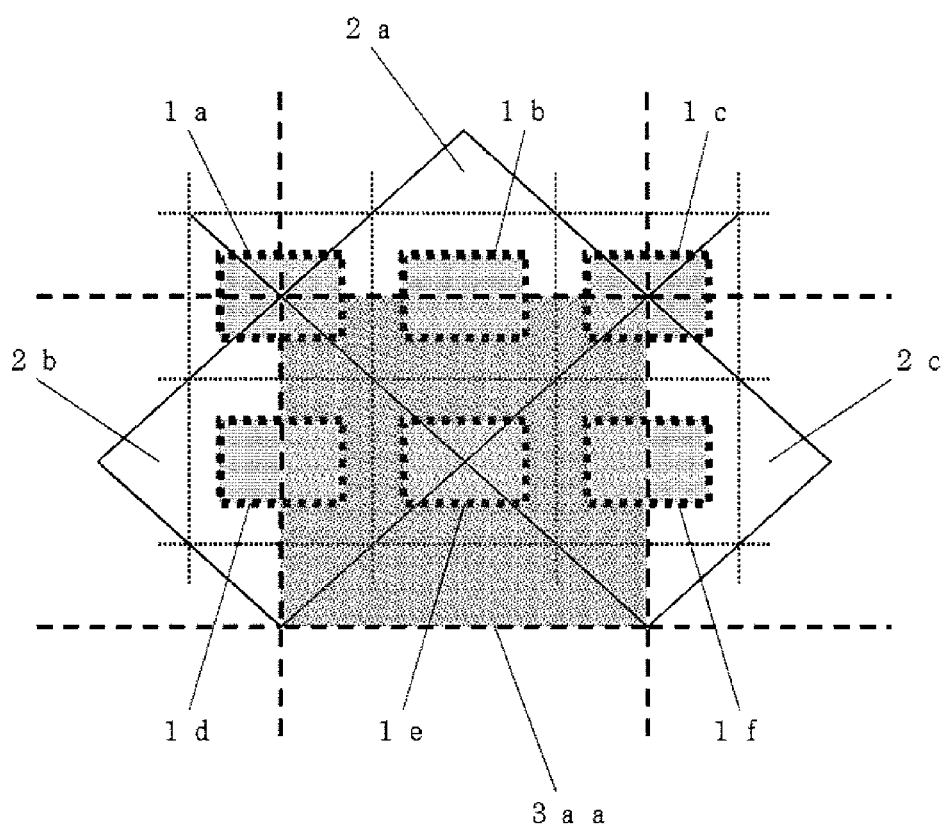
FIG. 9 illustrates a planar layout for an image sensor as a third preferred embodiment of the present invention.

FIG. 9 is a top plan view of an image sensor illustrating the relative arrangement of micro condenser lenses with respect to pixels according to this preferred embodiment. A micro condenser lens 3aa arranged on the reverse side is also shown in FIG. 9 and has its profile indicated by the dashed lines. The micro condenser lens 3aa has four times as large an area as a single pixel and focuses the light that has been incident on the reverse side onto a photosensitive cell 1e. On the front side, shown are micro condenser lenses 2a, 2b and 2c, which have the same configuration as their counterparts 2a, 2b and 2c of the first preferred embodiment described above.

Figure 10A:
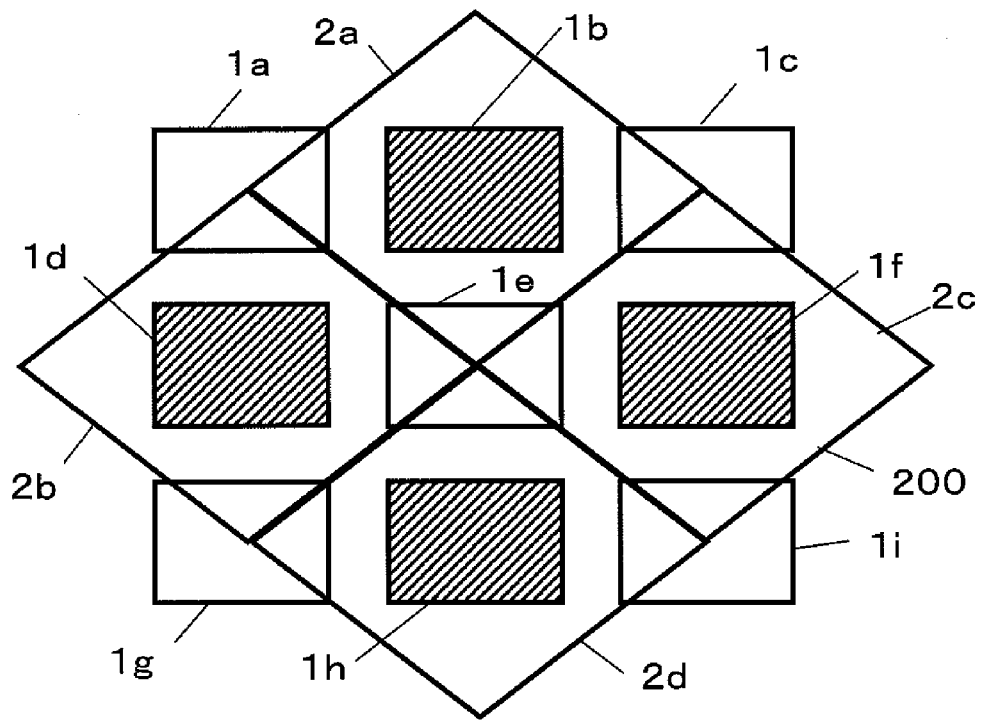
FIG. 10A is a top plan view of an image sensor according to the third preferred embodiment of the present invention.

FIG. 10A illustrates a planar layout for the front side of the solid-state image sensor of this preferred embodiment and covers a broader range than FIG. 9 does. FIG. 10B illustrates a planar layout for the reverse side of the solid-state image sensor of this preferred embodiment and covers the same range as FIG. 10A.

Just like the first preferred embodiment described above, each pixel region of this solid-state image sensor has a rectangular shape. On the other hand, the micro condenser lenses 2 provided for the front side of this solid-state image sensor have a diamond shape. The relative arrangement of the micro condenser lenses 2a, 2b and 2c with respect to their associated pixel regions is the same as in the first preferred embodiment described above. Meanwhile, the micro condenser lens 3aa provided for the reverse side of this solid-state image sensor has four times as large an area as a single pixel region. However, that micro condenser lens 3aa focuses the incoming light onto only one-fourth of all pixels.

Thus, according to this preferred embodiment, even if the micro condenser lenses 2a, 2b, 2c, etc. on the front side are translated with respect to the micro condenser lens 3aa on the reverse side, those micro condenser lenses on the two sides will not lie one on top of another.

Figure 10B:
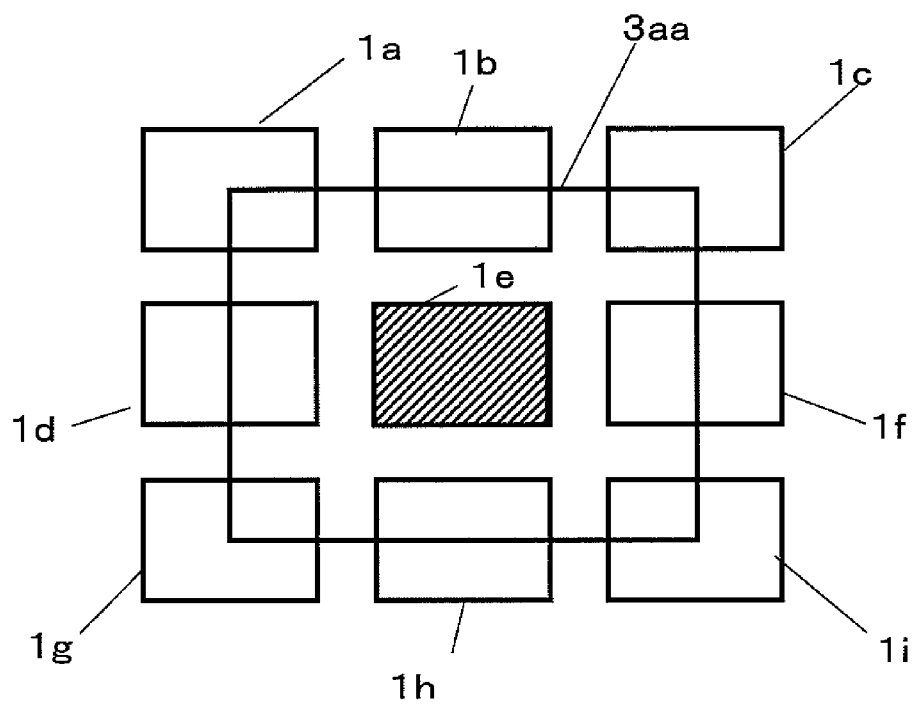
FIG. 10B is a bottom plan view of the image sensor according to the third preferred embodiment of the present invention.

As can be seen easily by comparing FIGS. 10A and 10B to each other, the micro condenser lenses are arranged in two different patterns on the front and reverse sides, and therefore, the spatial frequency of image capturing and sampling on the front side can be different from the frequency on the reverse side.

According to this preferred embodiment, even though only a half of all pixels are used for capturing an image on the front side of the solid-state image sensor, the image can be captured without decreasing the resolution, because the micro condenser lenses 2 are arranged in association with a pixel shifted arrangement. On top of that, as each of the micro condenser lenses 2a, 2b and 2c has twice as large an area as its associated pixel region, the sensitivity can be doubled. On the other hand, as only one-fourth of all pixels are used for capturing an image on the reverse side of the image sensor, the resolution decreases to a half both horizontally and vertically. However, as the micro condenser lens 3aa has four times as large an area as its associated pixel region, the sensitivity can be increased fourfold, too. According to this preferred embodiment, not only can images be captured separately from each other on the front and reverse sides of the solid-state image sensor but also can their resolutions and sensitivities be different from each other as well.

As described above, according to the third preferred embodiment of the present invention, in a dual-side illumination image sensor, diamond micro condenser lenses are arranged with respect to their associated rectangular pixel regions on the front side as described above. As a result, a high-sensitivity image can be obtained without decreasing the resolution at all. On the reverse side, on the other hand, a micro condenser lens, which has four times as large an area as each pixel region, is provided for the pixel regions, the resolution certainly decreases to a half both horizontally and vertically alike. However, a different image, of which the sensitivity has been increased fourfold, can still be obtained separately, which is beneficial.

(Embodiment 4)

Figure 11:
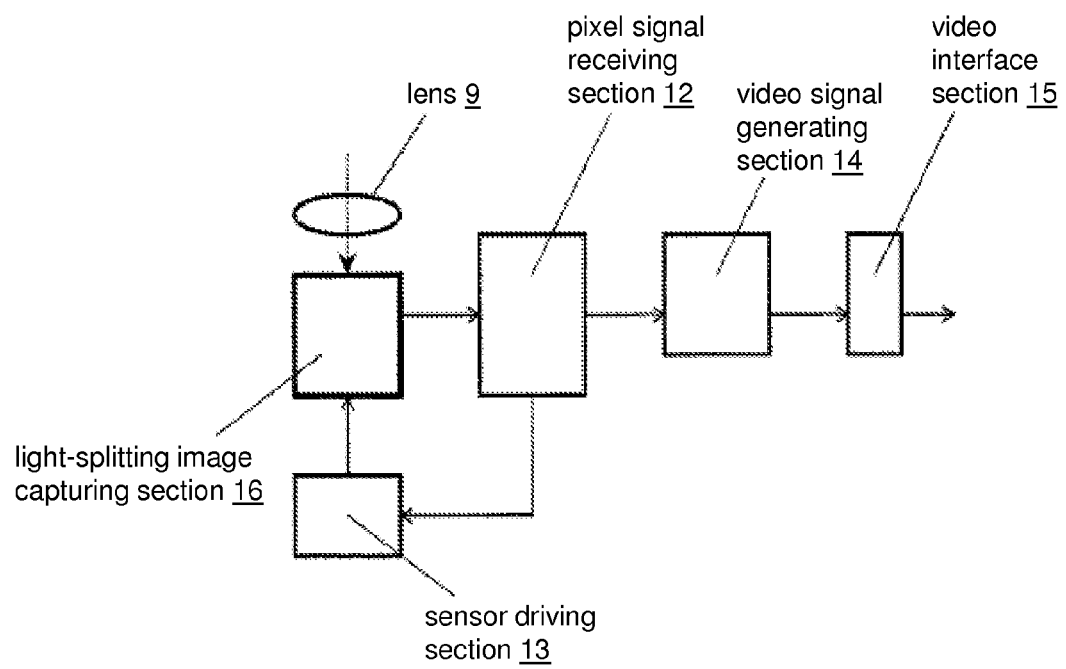
FIG. 11 illustrates an arrangement for an image capture device as a fourth preferred embodiment of the present invention.

Hereinafter, another preferred embodiment of an image capture device according to the present invention will be described with reference to FIG. 11. The image capture device of this preferred embodiment includes the image sensor of the first preferred embodiment described above.

The image capture device of this preferred embodiment has a single lens. The image capture device shown in FIG. 11 includes a light-splitting image capturing section 16 for splitting the light that has come from that lens 9 into two light beams and making those two light beams imaged on the front and reverse sides of the dual-side illumination image sensor 11, which is a major difference from the image capture device shown in FIG. 7. In the other respects, however, the image capture device of this preferred embodiment has the same basic configuration as its counterpart of the first preferred embodiment described above.

Figure 12:
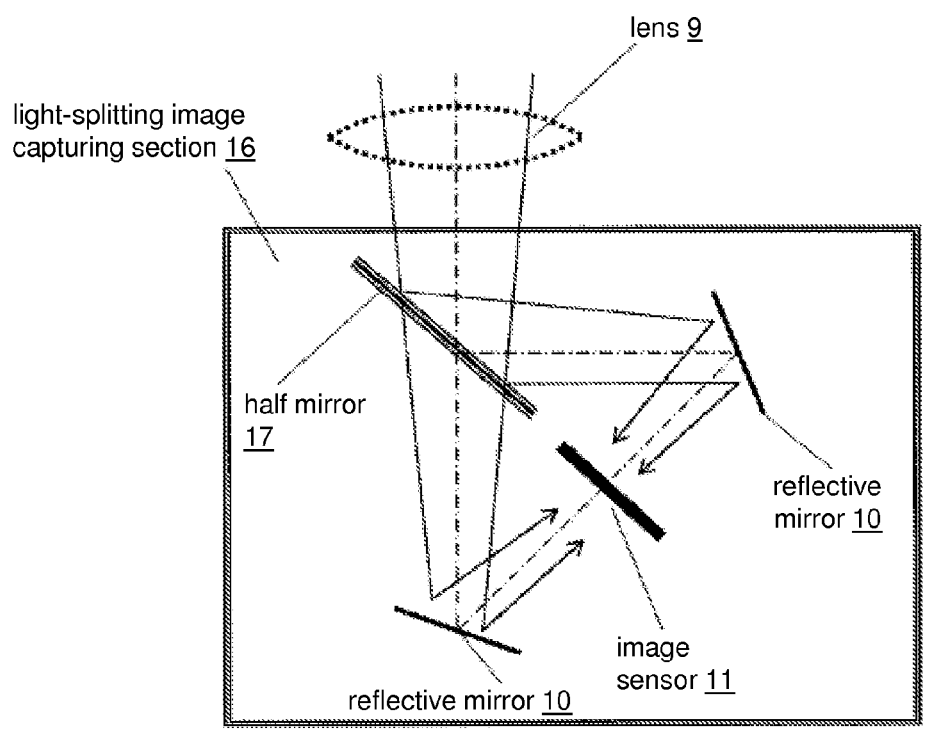
FIG. 12 illustrates an arrangement for a light-splitting image capturing section according to the fourth preferred embodiment of the present invention.

FIG. 12 illustrates an exemplary arrangement for the light-splitting image capturing section 16. The light that has come from the lens 9 is split by a half mirror 17 into two light beams, which are then reflected by reflective mirrors 10 toward the dual-side illumination image sensor 11. This light-splitting image capturing section 16 has been adjusted so that the two incoming light beams are imaged at the same position with optically the same zoom power.

Since the solid-state image sensor of the first preferred embodiment described above is used according to this preferred embodiment, two different images are captured separately on the front and reverse sides of the solid-state image sensor. On top of that, the sensitivity of those images can be twice as high as the normal one without decreasing their resolution horizontally or vertically. Furthermore, since the light-splitting image capturing section 16 is used, the locations of the two images captured by the solid-state image sensor 11 are different from each other by just one pixel. Thus, interpolation can be made between two diagonally adjacent pixels by combining those two images together. That is to say, an image can be obtained with its oblique resolution increased.

Two split light beams are incident on the solid-state image sensor 11. Thus, the quantity of light incident on each of the front and reverse sides of the solid-state image sensor 11 is a half of the quantity of the incoming light that has entered the lens 9. But as each micro condenser lens has twice as large an area as its associated pixel region, the quantity of the light received eventually remains the same and the sensitivity neither increases nor decreases.

Consequently, according to this preferred embodiment, two images that have been captured at two different positions can be obtained on a pixel-by-pixel basis by introducing the light-splitting image capturing section that uses a half mirror. And by combining those two images together, the resultant image can have an obliquely increased resolution.

If the quantity of the light received by the photosensitive cells on the front side is different from that of the light received on the reverse side due to some structural problem of the solid-state image sensor, then the quantities of the light received on the front and reverse sides are preferably adjusted by changing the transmittance of the transparent material on the reverse side. In the preferred embodiments of the present invention described above, the photosensitive cells and the pixel regions are supposed to have a rectangular shape or a diamond shape.

However, the same effects are achieved even if the photosensitive cells or the pixel regions do not have exactly such a shape. The same can be said about the shape of the micro condenser lenses, too.

Industrial Applicability

The solid-state image sensor of the present invention can be used extensively in cameras for general consumers including so-called "digital cameras" and "digital movie cameras", camcorders for TV broadcast personnel, industrial cameras, and so on.

REFERENCE SIGNS LIST 1, 1a, 1b, 1c, 1d, 1e, 1f, 1g, 1h, and 1i photosensitive cells of image sensor
2 micro condenser lens
    2a, 2b, 2c, 2d micro condenser lenses arranged on the front side of semiconductor layer
3 micro condenser lens
    3a, 3b, 3c, 3d, 3e, 3f, 3aa micro condenser lenses arranged on the reverse side of semiconductor layer
4 pixel region
5 wiring
6 transparent material layer
7 low-refractive-index transparent layer
8 transparent substrate
9 lens
10 reflective mirror
11 dual-side illumination image sensor
12 signal generating and pixel signal receiving section
13 sensor driving section
14 video signal generating section
15 video interface section
16 light-splitting image capturing section
17 half mirror
100 semiconductor layer
100a first side (front side) of the semiconductor layer
100b second side (reverse side) of the semiconductor layer
200 first array of micro condenser lenses (front-side micro lens array)
300 second array of micro condenser lenses (reverse-side micro lens array)

The invention claimed is:

1. A solid-state image sensor comprising:
   a semiconductor layer having first and second surfaces, the second surface being opposite to the first surface;
   a plurality of photosensitive cells, which are arranged two-dimensionally in the semiconductor layer between the first and second surfaces thereof;
   a first array of micro condenser lenses, which are arranged on the same side as the first surface in order to focus incoming light onto a first group of photosensitive cells that are included in those photosensitive cells to the exclusion of a second group of photosensitive cells that are also included in those photosensitive cells; and
   a second array of micro condenser lenses, which are arranged on the same side as the second surface in order to focus incoming light onto the second group of photosensitive cells to the exclusion of the first group of photosensitive cells, wherein the second group of photosensitive cells are different from the first group of photosensitive cells;
   wherein the arrangement pitch of the micro condenser lenses that form the first array is twice as long as that of the pixel regions.

2. The solid-state image sensor of claim 1, wherein the photosensitive cells are arranged in columns and rows, and
   wherein the photosensitive cells that form the first and second groups are arranged so that photosensitive cells belonging to these two groups alternate with each other in both column and row directions.

3. The solid-state image sensor of claim 2, wherein each of the multiple photosensitive cells is located within an associated one of multiple rectangular pixel regions.

4. The solid-state image sensor of claim 2, wherein each of the micro condenser lenses that form the first array has a diamond shape.

5. The solid-state image sensor of claim 2, wherein each of the micro condenser lenses that form the second array has a diamond shape.

6. The solid-state image sensor of claim 3, wherein each of the micro condenser lenses that form the second array has a rectangular shape.

7. The solid-state image sensor of claim 1, wherein each of the micro condenser lenses that form the first array has twice as large an area as its associated one of the pixel regions.

8. The solid-state image sensor of claim 1, wherein the arrangement pitch of the micro condenser lenses that form the second array is twice as long as that of the pixel regions.

9. The solid-state image sensor of claim 8, wherein each of the micro condenser lenses that form the second array has twice as large an area as its associated one of the pixel regions.

10. The solid-state image sensor of claim 1, wherein the arrangement of micro condenser lenses that form the first array and the arrangement of micro condenser lenses that form the second array will lie one on top of another in a plan view if one of these two arrangements is translated with respect to the other arrangement.

11. The solid-state image sensor of claim 1, wherein the arrangement of micro condenser lenses that form the first array and the arrangement of micro condenser lenses that form the second array will not lie one on top of another in a plan view even if one of these two arrangements is translated with respect to the other arrangement.

12. The solid-state image sensor of claim 1, wherein each of the micro condenser lenses that form the first array has a different area from an associated one of the micro condenser lenses that form the second array.

13. The solid-state image sensor of claim 1, wherein the photosensitive cells are arranged so that one row of photosensitive cells is shifted by a half pitch from an adjacent row of photosensitive cells, and wherein if one row of photosensitive cells belongs to the first group, each adjacent row of photosensitive cells belongs to the second group.

14. The solid-state image sensor of claim 13, wherein the photosensitive cells are located within multiple diamond pixel regions.

15. The solid-state image sensor of claim 14, wherein each of the micro condenser lenses that form the first and second arrays has a rectangular shape.

16. An image capture device comprising a solid-state image sensor and an optical system that makes light incident on the solid-state image sensor, wherein the solid-state image sensor comprises:
a semiconductor layer having first and second surfaces, the second surface being opposite to the first surface;
a plurality of photosensitive cells, which are arranged two-dimensionally in the semiconductor layer between the first and second surfaces thereof;
a first array of micro condenser lenses, which are arranged on the same side as the first surface in order to focus incoming light onto a first group of photosensitive cells that are included in those photosensitive cells to the exclusion of a second group of photosensitive cells that are also included in those photosensitive cells; and
a second array of micro condenser lenses, which are arranged on the same side as the second surface in order to focus incoming light onto the second group of photosensitive cells to the exclusion of the first group of photosensitive cells, wherein the second group of photosensitive cells are different from the first group of photosensitive cells, and wherein the optical system makes light that has come from a subject incident on the first and second arrays and the arrangement pitch of the micro condenser lenses that form the first array is twice as long as that of the pixel regions.

* * * * *